(12) United States Patent
Léomant et al.

(10) Patent No.: US 9,502,401 B2
(45) Date of Patent: Nov. 22, 2016

(54) INTEGRATED CIRCUIT WITH FIRST AND SECOND SWITCHING DEVICES, HALF BRIDGE CIRCUIT AND METHOD OF MANUFACTURING

(71) Applicant: Infineon Technologies Austria AG, Villach (AT)

(72) Inventors: Sylvain Léomant, Villach (AT); Martin Vielemeyer, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/968,505

(22) Filed: Aug. 16, 2013

(65) Prior Publication Data

US 2015/0048420 A1    Feb. 19, 2015

(51) Int. Cl.

| | | |
|---|---|---|
| *H01L 27/088* | (2006.01) | |
| *H01L 29/778* | (2006.01) | |
| *H01L 21/02* | (2006.01) | |
| *H01L 29/417* | (2006.01) | |
| *H01L 29/423* | (2006.01) | |
| *H01L 29/40* | (2006.01) | |
| *H01L 29/78* | (2006.01) | |
| H01L 29/20 | (2006.01) | |
| H01L 29/16 | (2006.01) | |

(52) U.S. Cl.
CPC ....... *H01L 27/088* (2013.01); *H01L 21/02636* (2013.01); *H01L 29/407* (2013.01); *H01L 29/4175* (2013.01); *H01L 29/41766* (2013.01); *H01L 29/42356* (2013.01); *H01L 29/7786* (2013.01); *H01L 29/7788* (2013.01); *H01L 29/7803* (2013.01); *H01L 29/7813* (2013.01); H01L 29/1608 (2013.01); H01L 29/2003 (2013.01)

(58) Field of Classification Search
CPC ........... H01L 21/8224; H01L 27/0821; H01L 29/4175; H01L 29/66333; H01L 29/66348; H01L 29/66666; H01L 29/7395
USPC .................................................. 257/183–201
See application file for complete search history.

(56) References Cited

U.S. PATENT DOCUMENTS

| | | | | |
|---|---|---|---|---|
| 4,816,892 | A * | 3/1989 | Temple | ............... H01L 29/7455 257/137 |
| 5,608,237 | A * | 3/1997 | Aizawa et al. | ............... 257/132 |
| 6,274,892 | B1 * | 8/2001 | Kub et al. | ..................... 257/131 |
| 7,235,857 | B2 * | 6/2007 | Majumdar et al. | ........... 257/510 |
| 7,459,750 | B2 | 12/2008 | Ludikhuize et al. | |
| 7,915,645 | B2 * | 3/2011 | Briere | ........................... 257/195 |
| 8,017,978 | B2 * | 9/2011 | Lidow | ..................... H01L 25/18 257/103 |
| 8,018,031 | B2 * | 9/2011 | Yanagida | ..................... 257/621 |

(Continued)

FOREIGN PATENT DOCUMENTS

CN    102986027 A    3/2013

*Primary Examiner* — Eric Ward
(74) *Attorney, Agent, or Firm* — Murphy, Bilak & Homiller, PLLC

(57) ABSTRACT

An integrated circuit includes a first switching device including a first semiconductor region in a first section of a semiconductor portion and a second switching device including a second semiconductor region in a second section of the semiconductor portion. The first and second sections as well as electrode structures of the first and second switching devices outside the semiconductor portion are arranged along a vertical axis perpendicular to a first surface of the semiconductor portion.

15 Claims, 18 Drawing Sheets

(56) References Cited

U.S. PATENT DOCUMENTS

| | | |
|---|---|---|
| 8,310,007 B2 | 11/2012 | Darwish et al. |
| 9,041,067 B2* | 5/2015 | Briere ................ H01L 21/8252 |
| | | 257/195 |
| 2010/0224876 A1* | 9/2010 | Zhu .................................. 257/52 |
| 2010/0276752 A1 | 11/2010 | Hébert |
| 2011/0095358 A1* | 4/2011 | Micciche' ........... H01L 27/0694 |
| | | 257/328 |
| 2012/0228696 A1 | 9/2012 | Carpenter et al. |
| 2012/0274366 A1 | 11/2012 | Briere |
| 2012/0293147 A1 | 11/2012 | Briere |
| 2014/0091366 A1* | 4/2014 | Jeon et al. ..................... 257/195 |
| 2014/0167112 A1* | 6/2014 | Briere ................... H01L 25/105 |
| | | 257/194 |
| 2015/0014740 A1* | 1/2015 | Briere .......................... 257/133 |
| 2015/0035170 A1* | 2/2015 | Nikitin ................ H01L 23/3735 |
| | | 257/777 |

\* cited by examiner

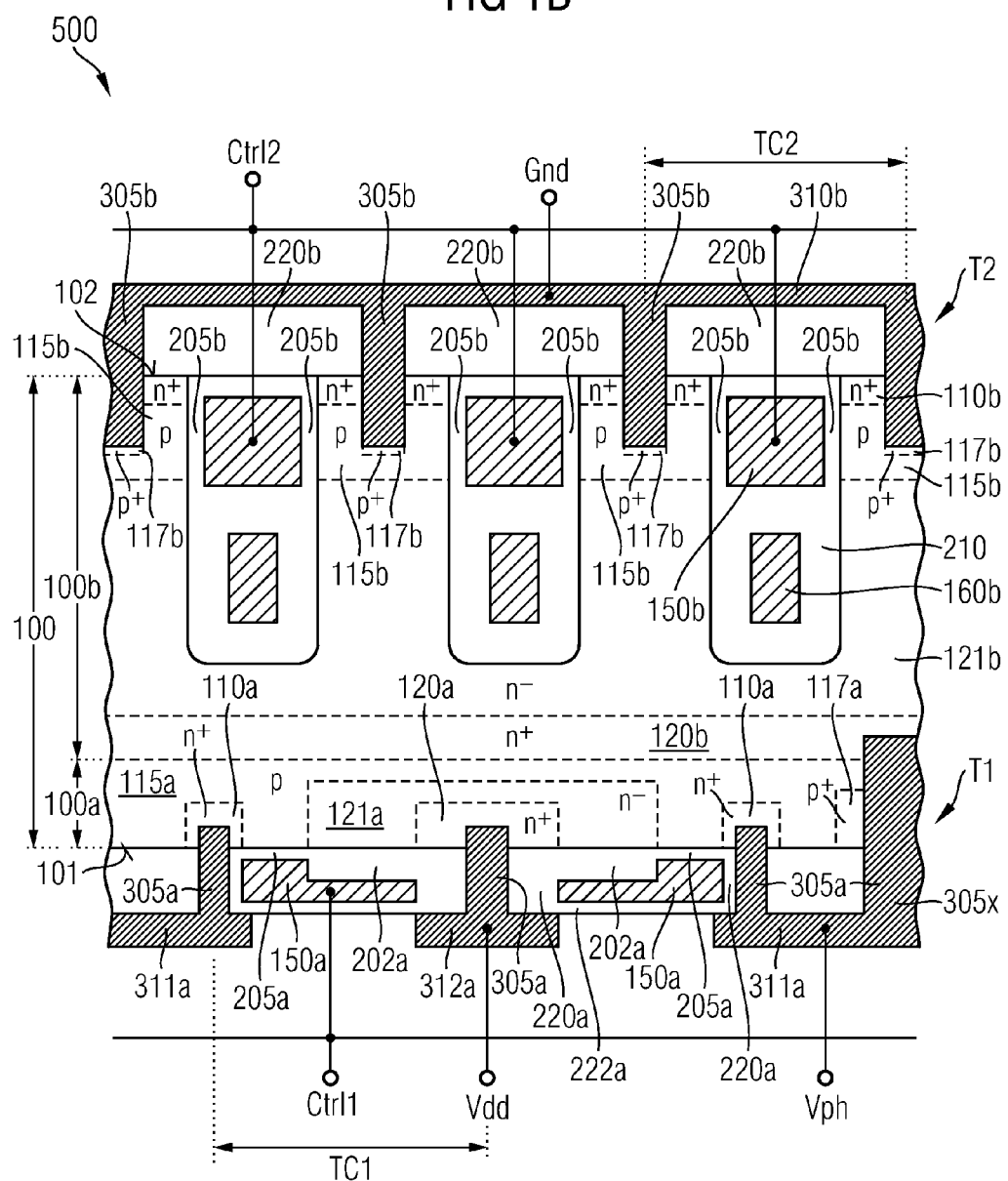

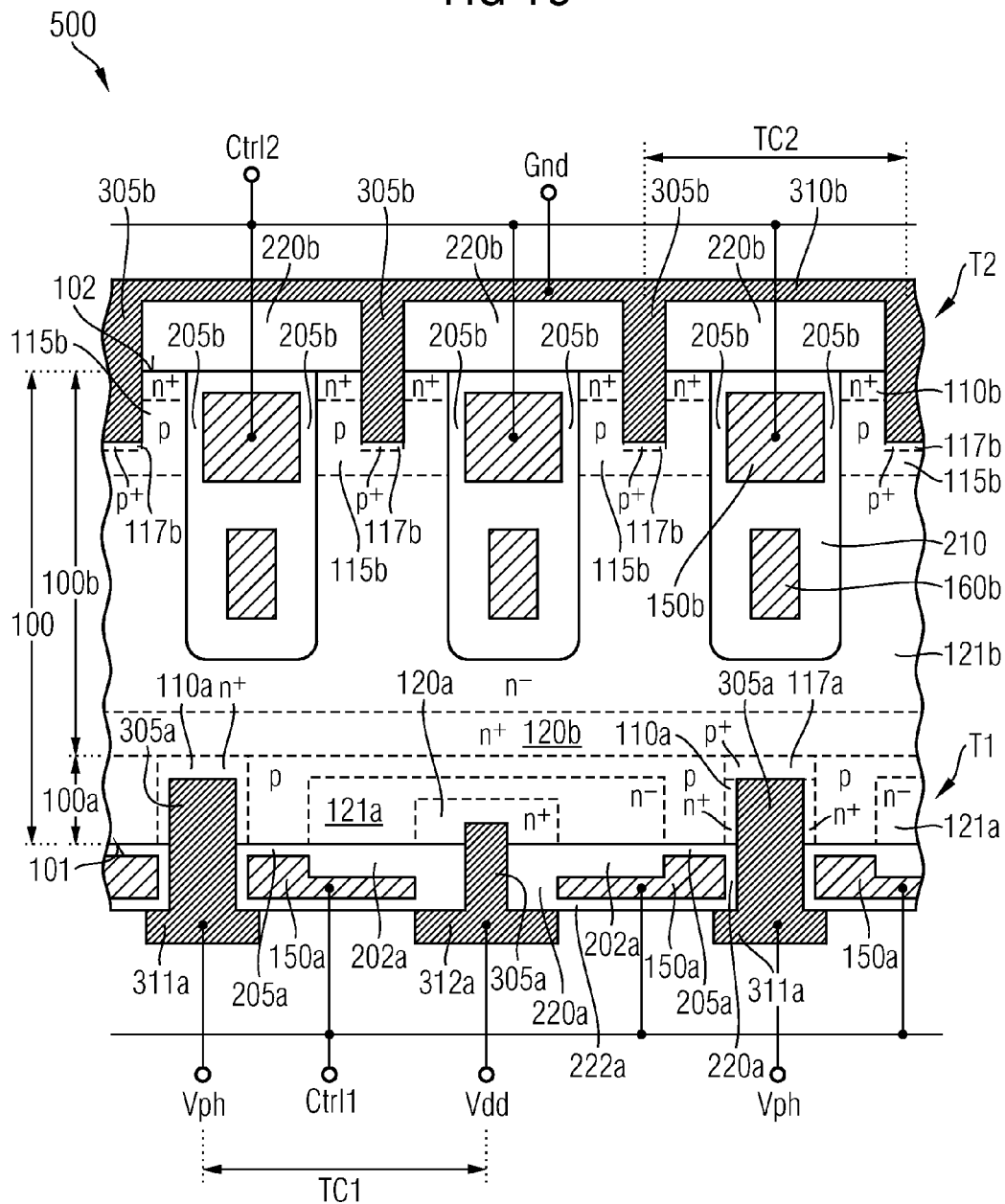

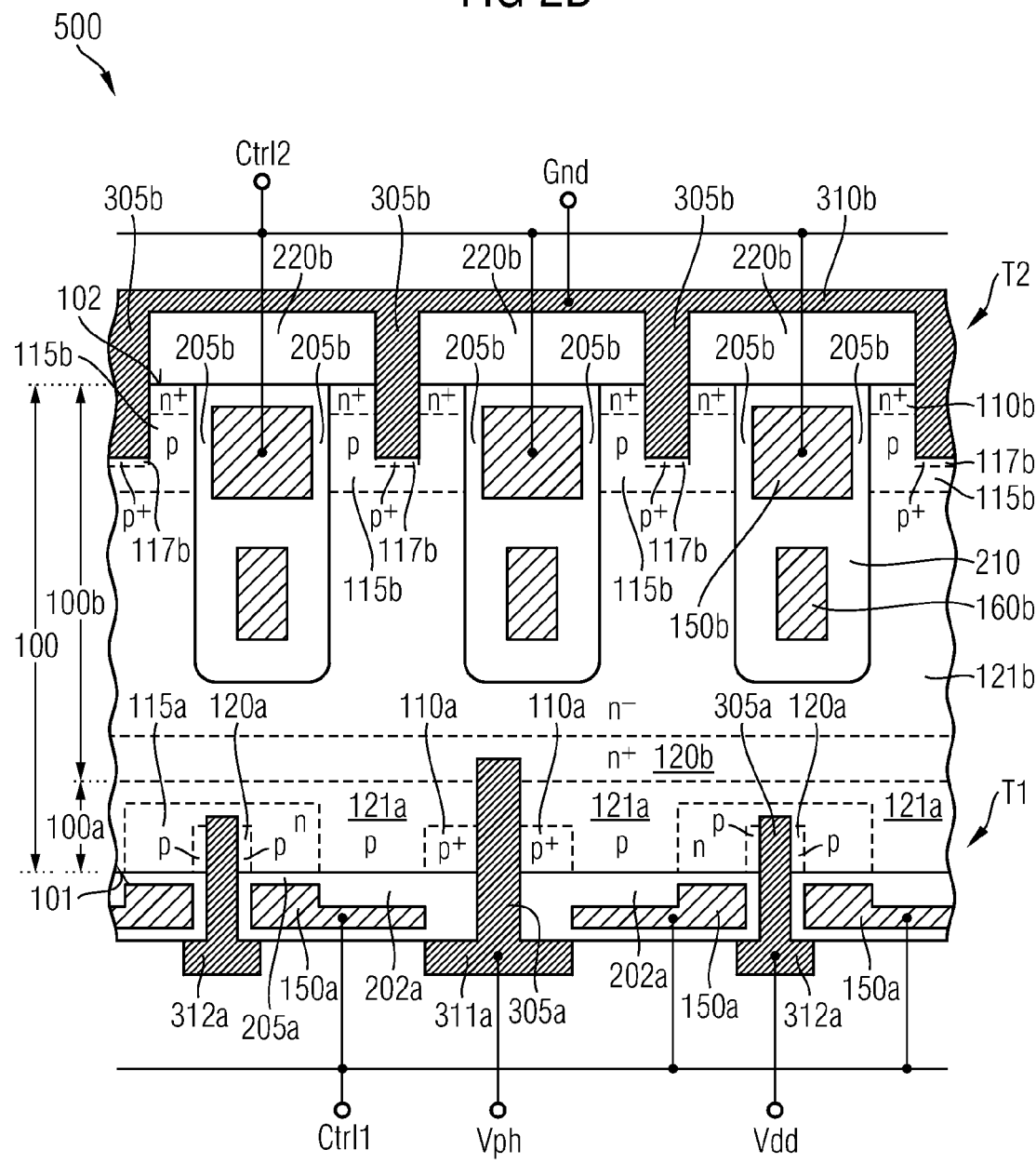

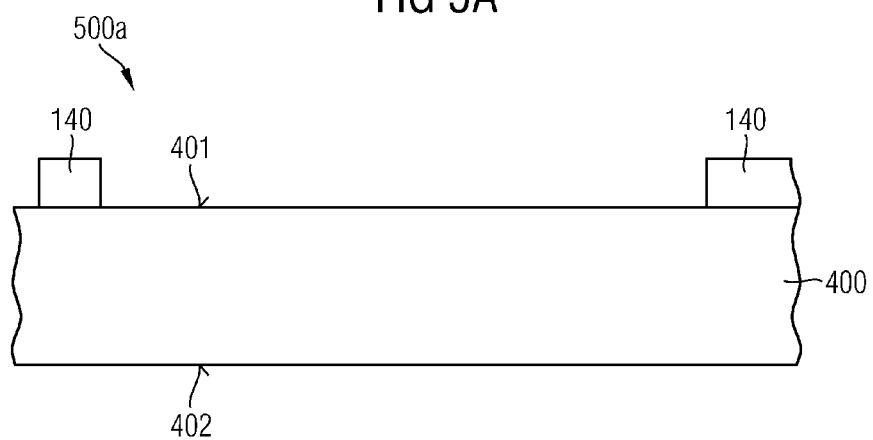
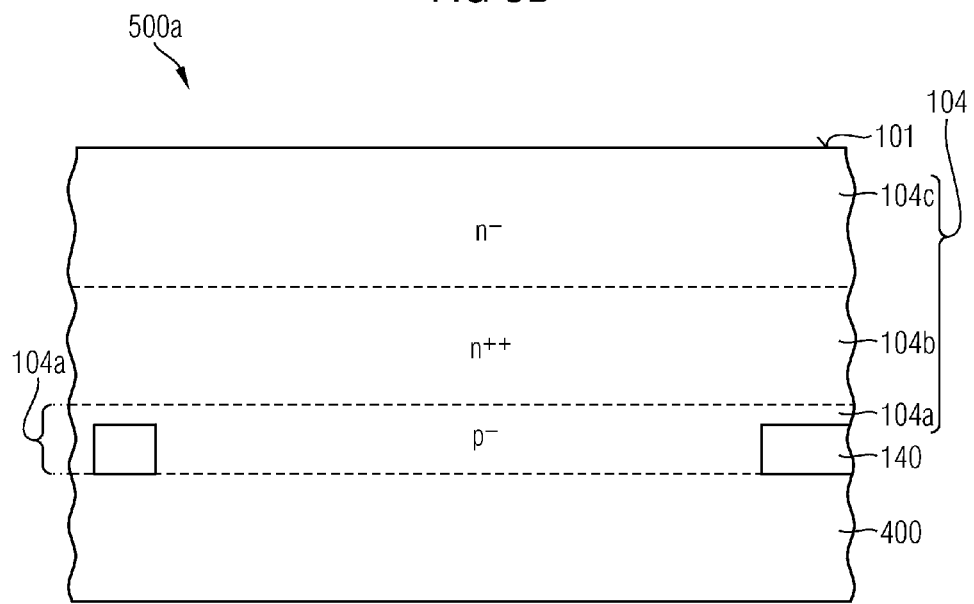

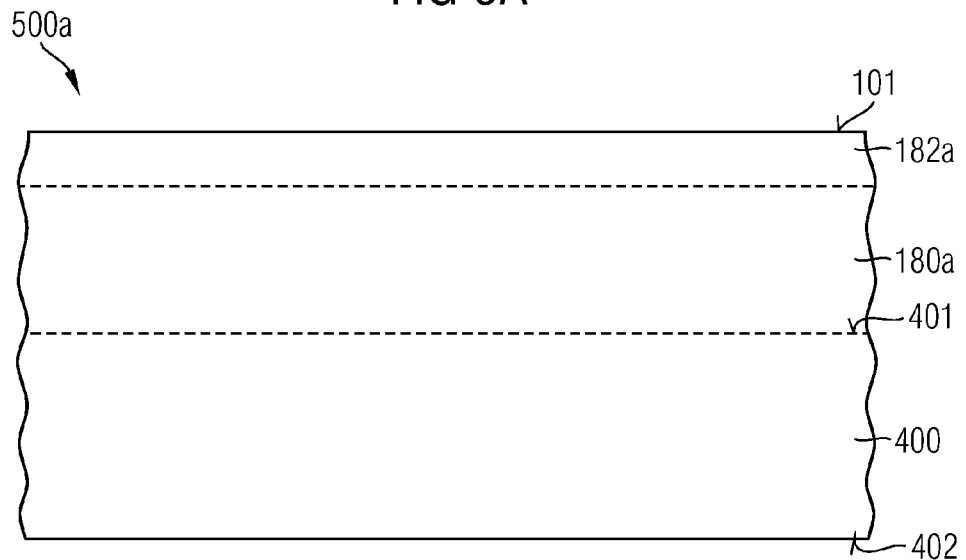
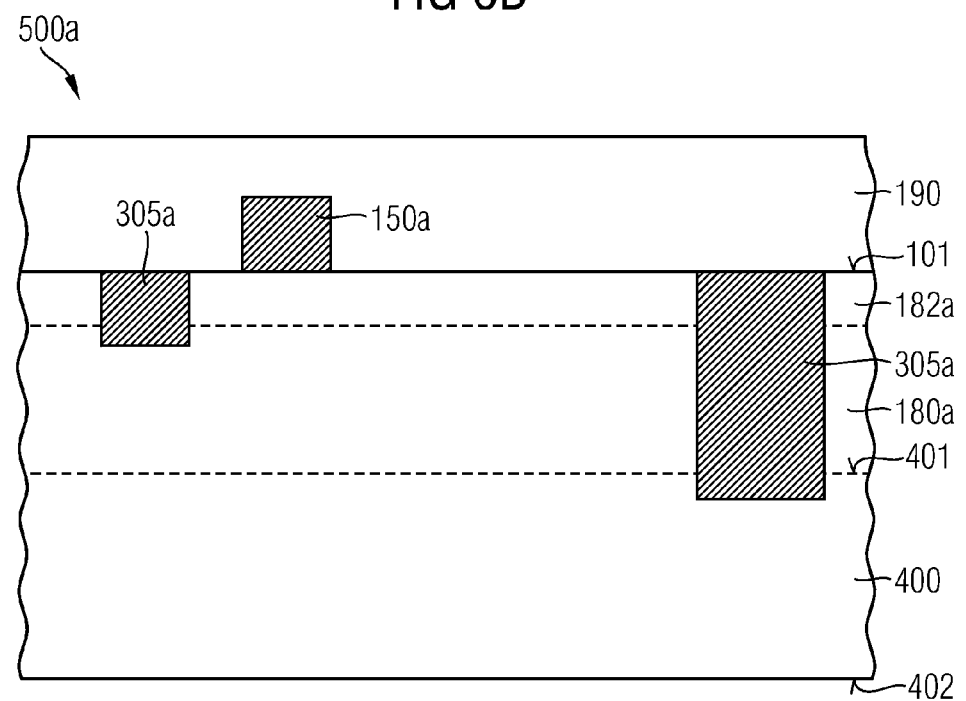

INTEGRATED CIRCUIT WITH FIRST AND SECOND SWITCHING DEVICES, HALF BRIDGE CIRCUIT AND METHOD OF MANUFACTURING

BACKGROUND

Integrated circuits may integrate several switching devices. For example, integrated half bridge circuits combine high side and low side switches arranged side-by-side in the same semiconductor die. There is a need for improved power switching devices.

SUMMARY

According to an embodiment, an integrated circuit includes a first switching device including a first semiconductor region in a first section of a semiconductor portion and a second switching device including a second semiconductor region in a second section of the semiconductor portion. The first and second sections as well as electrode structures of the first and second switching devices outside the semiconductor portion are arranged along a vertical axis perpendicular to a first surface of the semiconductor portion.

Another embodiment refers to a method of manufacturing a semiconductor device. An epitaxial layer grows on a process surface of a base substrate. Processes applied to an exposed first surface of the epitaxial layer provide first transistor cells in the epitaxial layer, wherein each first transistor cell includes a first gate electrode. Processes applied to a surface opposite to the first surface provide second transistor cells, wherein each second transistor cell includes a second gate electrode.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 1B is a schematic cross-sectional view of a portion of the integrated circuit of FIG. 1A in accordance with an embodiment providing a lateral n-FET as high side switch and a vertical n-FET as low side switch.

FIG. 1C is a schematic cross-sectional view of a portion of the integrated circuit of FIG. 1A according to an embodiment providing a lateral n-FET as high side switch and a vertical n-FET as low side switch as well as a laterally patterned body connection for the high side switch.

FIG. 2B is a schematic cross-sectional view of a portion of the integrated circuit of FIG. 2A in accordance with an embodiment providing a lateral p-FET as high side switch and a vertical n-FET as low side switch.

FIG. 5A is a schematic cross-sectional view of a portion of a semiconductor substrate in an exemplary method of manufacturing a semiconductor device including vertically integrated switching devices after providing an auxiliary structure on a first process surface of a base substrate.

FIG. 5B is a schematic cross-sectional view of the semiconductor substrate portion of FIG. 5A after growing a first epitaxial layer on the base substrate.

FIG. 6A is a schematic cross-sectional view of a portion of a semiconductor substrate in an exemplary method of manufacturing an integrated circuit by providing vertically integrated HEMTs after growing a first epitaxial layer on a first process surface of a base substrate.

FIG. 6B is a schematic cross-sectional view of the semiconductor substrate portion of FIG. 6A after providing first transistor cells on and in the first epitaxial layer.

DETAILED DESCRIPTION

Figure 1A:
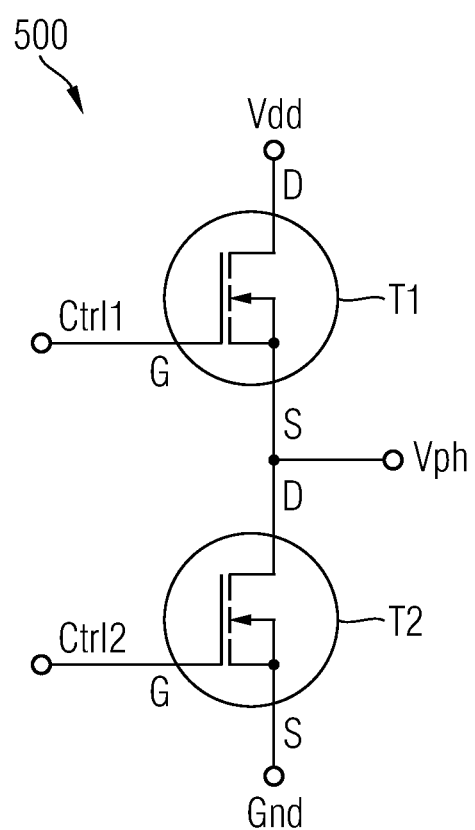
FIG. 1A is a schematic circuit diagram of an integrated circuit including a half bridge circuit with the low and high side switches embodied as n-FETs (n channel field effect transistors).

In the following detailed description, reference is made to the accompanying drawings, which form a part hereof, and in which are shown by way of illustrations specific embodiments in which the invention may be practiced. Other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language that should not be construed as limiting the scope of the appending claims. The drawings are not scaled and are for illustrative purposes only. For clarity, the same elements have been designated by corresponding references in the different drawings if not stated otherwise.

The terms "having," "containing," "including," "comprising" and the like are open and the terms indicate the presence of stated structures, elements or features but not preclude additional elements or features. The articles "a," "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p." For example, "n−" means a doping concentration that is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

The embodiments relate to integrated circuits vertically integrating at least a first and a second switching device T1, T2. Apart from the first and second switching devices T1, T2 the integrated circuits may include further switching devices, electronic circuits and/or semiconductor elements. Exemplary switching devices T1, T2 include a p-FET (p channel field effect transistor) of the depletion or enhancement mode, an n-FET of the depletion or enhancement mode, an HEMT or a JFET (junction field effect transistor).

With respect to two parallel main surfaces along which electrode structures of the first and second switching devices T1, T2 provide electric access to the switching devices T1, T2, each of the switching devices T1, T2 may be a lateral switching device or a vertical switching device, wherein in lateral switching devices a load current flows parallel to the main surfaces and wherein in vertical devices the load current flows in a vertical direction perpendicular to the main surfaces.

The load paths of the first and second switching devices T1, T2 may be electrically arranged in series, for example with two electrically connected control inputs or two separate control inputs, e.g. in a cascode configuration, or may be electrically arranged in parallel, for example with two separate or two electrically connected control inputs.

The embodiments of FIGS. 1A to 1E refer to an integrated circuit including n-FETs with load paths electrically arranged in series and usable, for example, as a half bridge circuit.

According to FIG. 1A, the first and second switching devices T1, T2 of an integrated circuit 500 may be FETs, e.g. Power MOSFETs, with the load paths between drain D and source S connected in series between a first load terminal Vdd and a second load terminal Gnd of the integrated circuit 500. The drain D of the first switching device T1 may be electrically connected or coupled to the first load terminal Vdd. The source S of the second switching device T2 may be electrically connected or coupled to the second load terminal Gnd. The source S of the first switching device T1 and the drain D of the second switching device T2 may be electrically connected to each other and to an output terminal Vph. The gate G of the first switching device T1 may be electrically coupled or connected to a first control terminal Ctrl1 and the gate G of the second switching device T2 may be electrically coupled or connected to a second control terminal Ctrl2. According to other embodiments, the gates G of the first and second switching devices T1, T2 may be electrically connected to each other or at least one of the gates G may be electrically connected to one of the load and output terminals Vdd, Gnd, Vph or to a driver circuit integrated in the integrated circuit 500.

FIG. 1B refers to an embodiment of the integrated circuit 500 of FIG. 1A with a lateral n-FET providing the first switching device T1 and a vertical n-FET providing the second switching device T2. The integrated circuit 500 is implemented on a semiconductor portion 100 of one or more single-crystalline semiconductor materials selected from a group including silicon (Si), silicon carbide (SiC), germanium (Ge), a silicon germanium crystal (SiGe), gallium nitride (GaN) and gallium arsenide (GaAs), for example. The semiconductor portion 100 may have an essentially planar first surface 101 and a planar second surface 102 parallel to the first surface 101 as main surfaces. A normal to the first surface 101 defines a vertical direction and directions orthogonal to the vertical direction are lateral directions.

The first switching device T1 includes a semiconductor region in a first section 100a of the semiconductor portion 100. The second switching device T2 includes a semiconductor region in a second section 100b of the semiconductor portion 100. The first and second sections 100a, 100b may be spaced from each other along the vertical direction, may form an interface parallel to the first and second surfaces 101, 102 or may partly, but not totally, overlap each other. Electrode structures 310b, 311a, 312a, which are electrically connected to the first and second switching devices T1, T2, are arranged in the vertical projection of the semiconductor portion 100.

The first switching device T1 may be a lateral n-FET of the enhancement type including a plurality of approximately identical first transistor cells TC1, which may be regularly arranged at regular distances along at least a first lateral direction. Each first transistor cell TC1 includes a first gate electrode 150a arranged outside the semiconductor portion 100 in a distance to the first surface 101 and a first gate dielectric 205a dielectrically insulating the first gate electrode 150a from the first semiconductor region in the first section 100a of the semiconductor portion 100.

The first section 100a the first semiconductor region of the first switching device T1 includes p-type first body zones 115a, which may be portions of a p-type epitaxial layer, as well as heavily doped n-type first source zones 110a and heavily doped n-type first drain zones 120a, which may extend as wells from the first surface 101 into the first substrate section 100a, respectively. A lightly doped n-type first drift zone 121a may be provided between the first body zone 115a and the first drain zone 120a of each first transistor cell TC1. First portions of the first body zones 115a separate the first source and drift zones 110a, 121a and adjoin the first surface 101. Second portions of the first body zones 115a separate the first source, drain and drift zones 110a, 120a, 121a from the second switching device T2.

The first gate dielectrics 205a dielectrically insulate the first gate electrodes 150a from the first portions of the first body zones 115a. First cell insulators 202a, which are thicker than the first gate dielectrics 205a, may dielectrically insulate the first gate electrodes 150a from the first drift and drain zones 121a, 120a.

First contact structures 305a extend between the first gate electrodes 150a into the semiconductor portion 100 and electrically connect the first source zones 110a with a first source electrode 311a and the first drain zones 130a with a first drain electrode 312a. The first source electrode 311a may be electrically connected or coupled to an output terminal Vph and the first drain electrode 312a may be electrically connected or coupled to a first load terminal Vdd of the integrated circuit 500. Dielectric spacers 220a are provided between the first contact structures 305a and the first gate electrodes 150a and a dielectric layer 222a may dielectrically insulate the first gate electrodes 150a from the first source and drain electrodes 311a, 312a.

The second switching device T2 may be a vertical n-FET of the enhancement type including a plurality of approximately identical second transistor cells TC2, which may be regularly arranged at equal distances along at least a first lateral direction. The vertical projections of the first and second semiconductor regions of the first and second switching devices T1, T2 overlap each other.

A center-to-center distance (pitch) between adjoining second transistor cells TC2 may be equal to, smaller than, or greater than the pitch of adjoining first transistor cells TC1. The second transistor cells TC2 are arranged in the vertical projection of at least some of the first transistor cells TC1, or vice versa.

Each second transistor cell TC2 includes a second gate electrode 150b buried in the semiconductor portion 100 at a distance to the second surface 102 and a second gate dielectric 205b dielectrically insulating the second gate electrode 150b from the second semiconductor region in the second section 100b of the semiconductor portion 100.

The semiconductor region of the second switching device T2 may include heavily doped n-type second source zones 110b directly adjoining the second surface 102, a lightly doped n-type second drift zone 121b, p-type second body zones 115b spatially separating the second source and drift zones 110b, 121b and a second drain zone 120b. The interfaces between the second body zones 115b and the second drift zones 121b as well as between the second drift and drain zones 121b, 120b may be parallel to the first and second surfaces 101, 102.

The second gate electrodes 150b are arranged in cell stripes extending from the second surface 102 into the semiconductor portion 100. The cell stripes may further include field electrodes 160b, wherein a field dielectric 210 dielectrically insulates the field electrodes 160b from the semiconductor material of the semiconductor portion 100 and the second gate electrodes 150b. Second gate dielectrics 205b dielectrically insulate the second gate electrodes 150b from the second body zones 115b.

A dielectric structure 220b directly adjoins the second surface 102. Second contact structures 305b extend through openings in the dielectric structure 220b into the semiconductor portion 100. The second contact structures 305b may electrically connect the second source and body zones 110b, 115b with a second source electrode 310b. The second source electrode 310b may be electrically connected or coupled to a second load terminal Gnd of the integrated circuit 500. Heavily doped p-type second contact zones 117b may directly adjoin a bottom portion of the second contact structures 305b to provide a low contact resistance between the second contact structures 305b and the second body zones 115b.

Device connection structure 305x may extend from the first surface 101 into the semiconductor portion 100 and may electrically connect the second drain zone 120b with the first source electrode 311a. Along sidewalls of the device connection structures 305x heavily doped first contact zones 117a may provide highly conductive connections between the second source electrode 311a and the first body zones 115a.

The vertical projections of first and second transistor cells TC1, TC2 overlap each other. The first transistor cells TC1 may be arranged in pairs, wherein the two transistor cells of each pair are arranged minor-inverted with regard to the first drain zone 120a shared by the concerned two first transistor cells TC1.

The embodiment of FIG. 1C differs from the embodiment of FIG. 1B in that the first source zones 110a are patterned along a lateral direction perpendicular to the cross-sectional plane. In first sections, the first source zones 110a extend from the first surface 101 to the second drain zone 120b and provide an electrical connection between the first source zones 110a of the first switching device T1 and the second drain zones 120b of the second switching device T2. In second sections, heavily doped p-type first contact zones 117a extend between the first source zones 110a and the second drain zones 120b and provide a low-resistivity connection between the adjoining first body zones 115a and the first contact structures 305a electrically connected to the first source electrode 311a. Along the lateral direction perpendicular to the cross-sectional plane, the heavily doped p-type first contact zones 117a alternate with sections of the heavily doped n-type first source zones 110a. The second drain zone 120b directly adjoins sections of the first source zones 110a.

Alternatively, heavily doped p-type first contact zones 117a separate the first source zones 115a from the second drain zone 120b and the first contact structures 305a extend into the second drain zone 120b such that the first contact structures 305a electrically connect the first source zones 110a, the second drain zones 120b, the first body zones 115a and the first source electrode 311a.

Figure 1D:
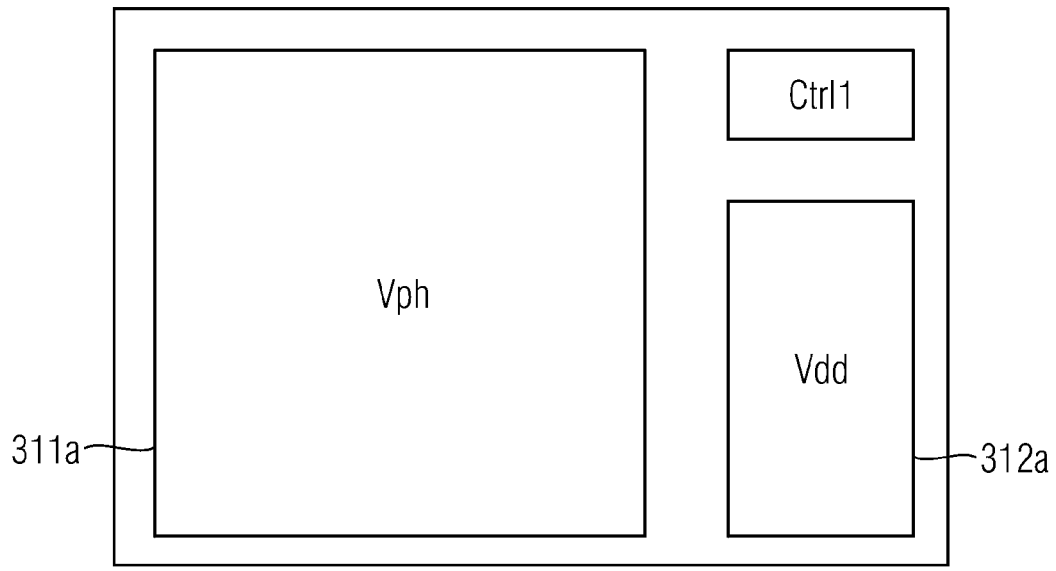
FIG. 1D is a schematic plan view of a first side of the integrated circuit of FIG. 1A according to an embodiment.

FIG. 1D is a schematic plan view of the electrode structures 311a, 312a of the integrated circuit 500 at a side of the first surface 101. The first source electrode 311a may form an output terminal Vph, or a terminal pad for a bonding connection to the output terminal Vdd. The first drain electrode 312a may form a first load terminal Vdd or a terminal pad for a bonding connection to the first load terminal Vdd. A first control terminal Ctrl1 or terminal pad for a bonding connection to the first control terminal Ctrl1 is electrically connected to the first gate electrodes 150a of FIGS. 1A-1C.

Figure 1E:
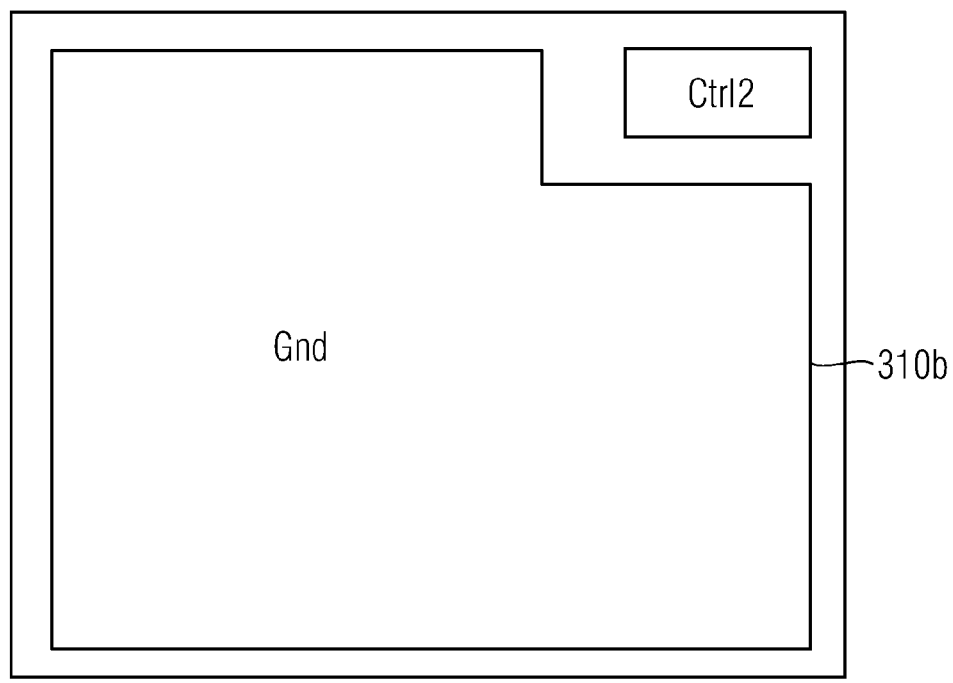
FIG. 1E is a schematic plan view of a second side of the integrated circuit of FIG. 1A according to an embodiment.

FIG. 1E shows the opposite side oriented to the second surface 102. The second source electrode 310b may form a second load terminal Vdd or a terminal pad for a bonding connection to the second load terminal Vdd. A second control terminal Ctrl2 or terminal pad for a bonding connection to the second control terminal Ctrl2 is electrically connected to the second gate electrodes 150b of FIGS. 1A-1C.

A further terminal or terminal pad may be electrically connected or coupled to the second field electrodes 160b. According to other embodiments, the second field electrodes 160b are electrically connected with the second source electrode 310b or the second gate electrodes 150b. According to other embodiments, both control terminals or terminal pads Ctrl1, Ctrl2 may be on the same side by providing a TSV (through-silicon via), for example.

The integrated circuit 500 may vertically integrate at least two switching devices T1, T2, e.g. the low side and high side switches of a half bridge. Low parasitic capacitance and electrical resistance between the high side and low side switches and allows for a high packaging density. The integrated circuit 500 may be a power semiconductor device.

Compared to co-packaged dies with the high side and low side switches processed in different dies obtained from different substrates and soldered on top of each other or side-by-side, one way that the integrated circuit 500 reduces packaging costs is that only one die must be handled and less package level interconnections are required.

Other than monolithic side-by-side implementations for half bridges, the integrated circuit 500 allows for significantly reducing the required chip area.

Figure 2A:
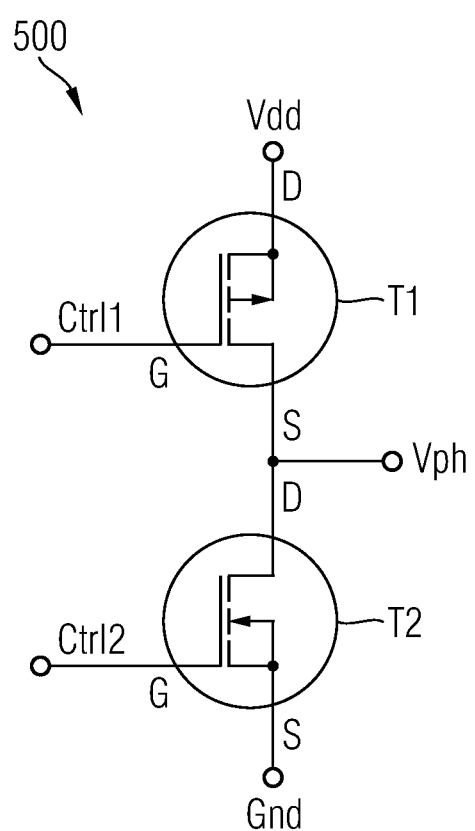
FIG. 2A is a schematic circuit diagram of an integrated circuit including a half bridge circuit with a p-FET high side switch and an n-FET low side switch.

FIGS. 2A to 2B refer to an integrated circuit 500 with a lateral p-FET providing the first switching device T1 and a vertical n-FET providing the second switching device T2. The second switching device T2 may correspond to the second switching device T2 of FIG. 1A. On the side of the first switching device T1, first contact structures 305a electrically connected to the first drain electrode 312a and the first load terminal Vdd directly adjoin the heavily doped p-type first drain zones 120a as well as the n-type first body zones 115a. First contact structures 305a electrically connected to the first source electrode 311a and the output terminal Vph directly adjoin the heavily doped n-type second drain zone 120b as well as the heavily doped p-type first source zones 110a. For further details reference is made to the description of FIG. 1A to 1E.

Figure 3A:
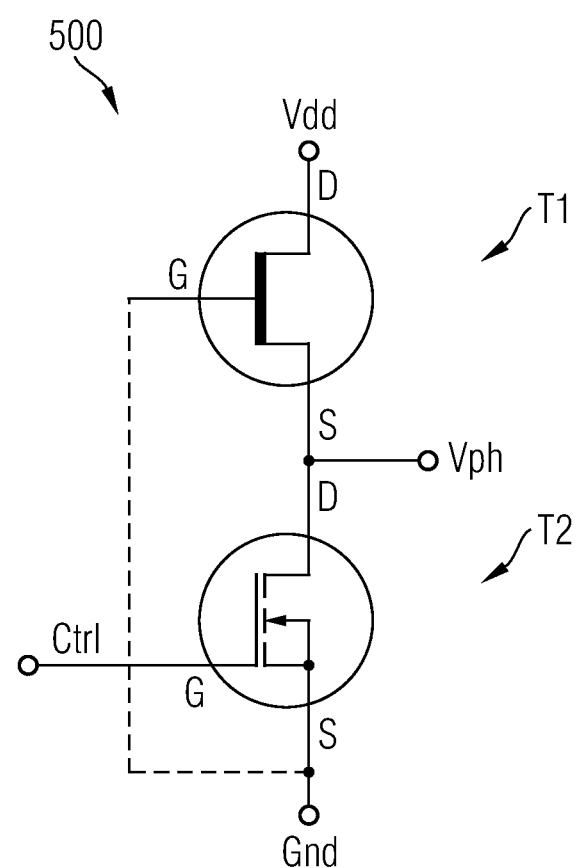
FIG. 3A is a schematic circuit diagram of an integrated circuit according to an embodiment including an HEMT (high electron mobility transistor) and an n-FET in a cascode configuration.
Figure 3B:
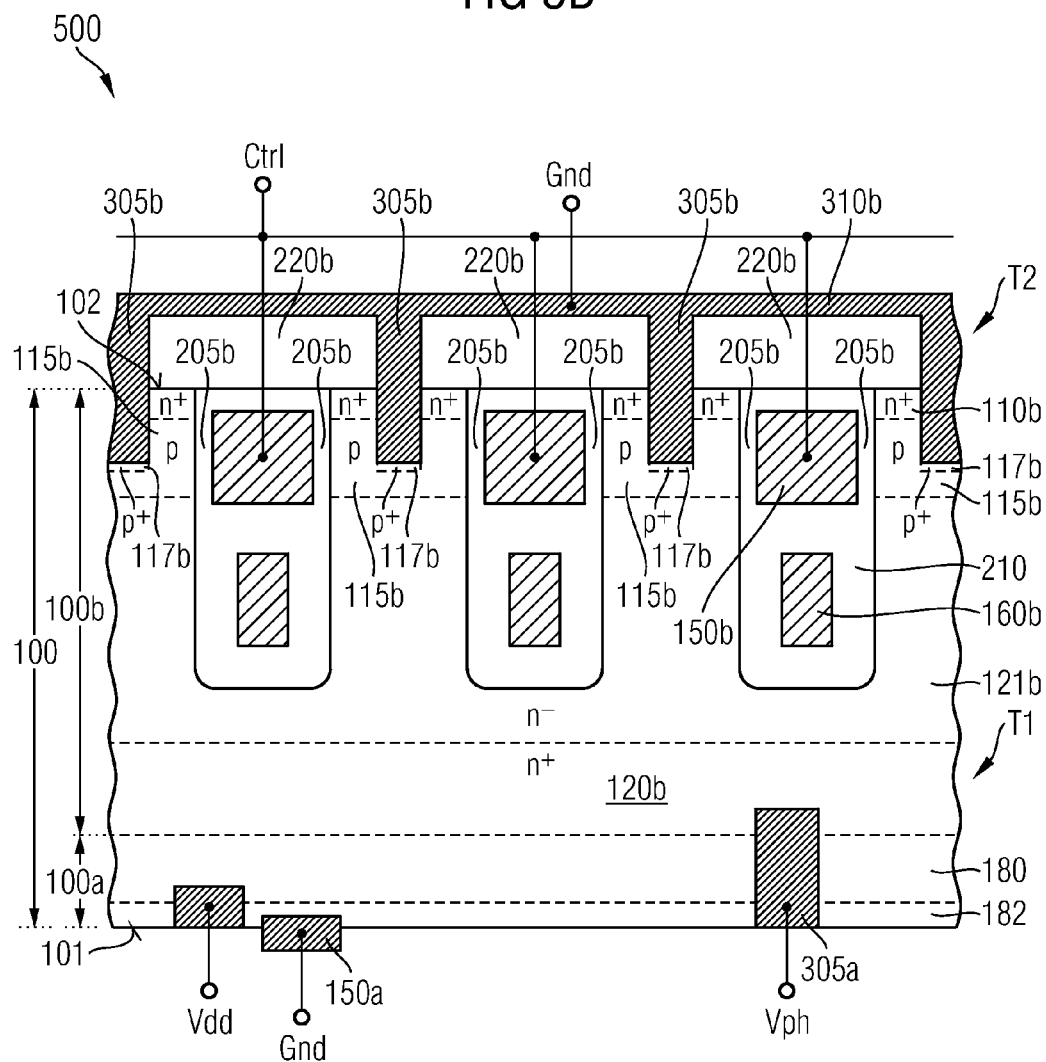
FIG. 3B is a schematic cross-sectional view of a portion of the integrated circuit of FIG. 3A in accordance with an embodiment providing a vertical n-FET.

FIGS. 3A to 3B refer to an embodiment that vertically integrates a lateral HEMT as the first switching device T1 and a vertical n-FET as the second switching device T2. The load paths of the first and second switching devices T1, T2 are electrically arranged in series. The first and second switching devices T1, T2 may be configured in a cascode connection with the gate G of the first switching device T1 being electrically connected to the source S of the second switching device T2.

The second switching device T2 may correspond to the second switching device T2 of FIG. 1A. The first switching device T1 may include at least a buffer layer 180 and a barrier layer 182, both provided from Group III nitrides or Group III arsenides, encompassing semiconductor compounds formed from nitrogen or arsenic and Group III elements as gallium (Ga), aluminum (Al) and indium (In) and including ternary and tertiary compounds like AlGaN and AlInGaN. The materials for the buffer and barrier layers 180, 182 are selected from Group III nitrides/arsenides such that the band gaps of the materials for the barrier and buffer layers 180, 182 differ significantly from each other and such that in proximity of the interface between the buffer and barrier layers 180, 182 a two-dimensional electron gas (2DEG) provides a conductive channel in the buffer layer 180.

The conductive channel extends between a drain electrode provided by a first contact structure 305a electrically connected to the first load terminal Vdd and a source electrode provided by a first contact structure 305a extending from the first surface 101 up to or into the heavily doped n-type second drain zone 120b. A first gate electrode 150a, which may include a portion containing a conductive Group III nitride or Group III arsenide material, may locally deplete or not deplete the conductive channel of the HEMT in response to a voltage applied to the first gate electrode 150a.

Figure 4A:
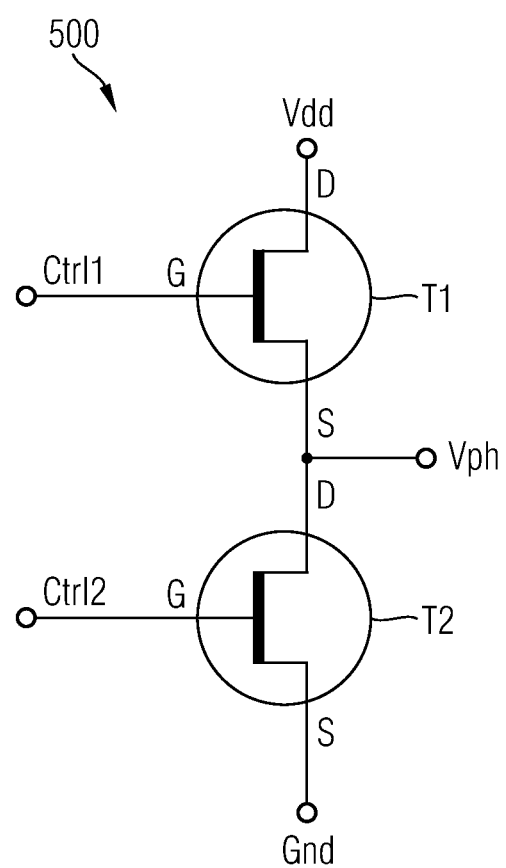
FIG. 4A is a schematic circuit diagram of an integrated circuit including two HEMTs electrically arranged in series.
Figure 4B:
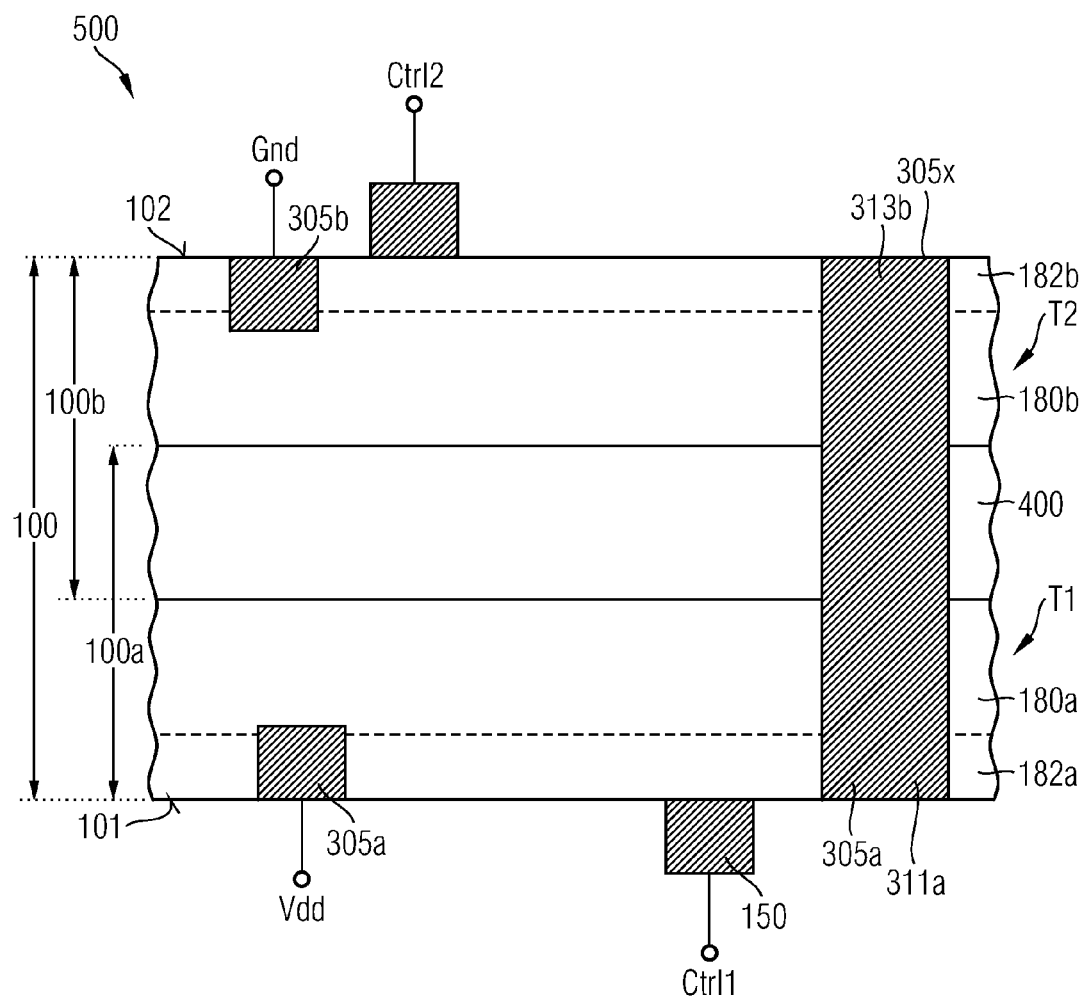
FIG. 4B is a schematic cross-sectional view of a portion of the integrated circuit of FIG. 4A.

The embodiment of FIGS. 4A and 4B combines two HEMTs as described above on opposing sides of a base substrate 400 shared by the two HEMTs. The material of the base substrate 400 may be GaAs, SiC, Si, GaN, Ge, SiGe, or sapphire, for example. The first switching device T1 is a HEMT including first buffer and barrier layers 180a, 182a, wherein the exposed surface of the first barrier layer 182a may form the first surface 101 of the semiconductor portion 100. The second switching device T2 is a HEMT including second buffer and barrier layers 180b, 182b, wherein the exposed surface of the second barrier layer 182b may form the second surface 102.

A device connection structure 305x may extend from the first surface 101 through the semiconductor portion 100 to the second surface 102, electrically connecting the first source electrode 311a of the first switching device T1 and the second drain electrode 313b of the second switching device T2.

According to other embodiments, a first portion of the device connection structure 305x may extend from the first surface 101 into the base substrate 400 and a second portion may extend from the second surface 102 into the base substrate 400. The first and second portions may directly adjoin each other. According to embodiments that include a highly conductive base substrate 400, a portion of the base substrate 400 may separate the first and second portions of the device connection structure 305x.

FIGS. 5A to 5G relate to a method of manufacturing an integrated circuit vertically integrating a first switching device with first transistor cells and a second switching device with second transistor cells.

A base substrate 400 of a semiconductor substrate 500a is provided from one or more dielectric or semiconducting materials, e.g., sapphire, intrinsic or heavily doped single crystalline silicon (Si), single crystalline germanium (Ge), a silicon germanium crystal (SiGe), silicon carbide (SiC), gallium nitride (GaN) or gallium arsenide (GaAs). An auxiliary structure 140 may be provided on a first process surface 401 of the base substrate 400.

FIG. 5A shows the auxiliary structure 140 formed on portions of the first process surface 401. The material of the auxiliary structure 140 and the material of the base substrate 400 may have significantly different etch properties. For example, the base substrate 400 is provided from heavily doped n-type single-crystalline silicon and the auxiliary structure 140 is provided from a dielectric material, for example a silicon oxide.

An epitaxy process grows an epitaxial layer 104 on the first surface 401 and laterally overgrows the auxiliary structures 140 such that the epitaxial layer 104 and the base substrate 400 embed the auxiliary structure 140. The materials of the base substrate 400 and the epitaxial layer 104 may have identical or approximately identical lattice constants such that the epitaxial layer 104 grows in registry with the crystal lattice of the base substrate 400. The first epitaxial layer 104 may consist of one homogeneously doped layer or may include two, three or more sub-layers differing from each other as regards a vertical impurity profile, a mean net impurity concentration and/or an impurity type. The mean net dopant concentration, conductivity type and vertical impurity profile of each sub-layer depends on the type of the switching device(s) to be formed in the first epitaxial layer 104.

In FIG. 5B the first epitaxial layer 104 is a single-crystalline silicon layer including a lightly doped p-type first sub-layer 104a, a heavily doped n-type second sub-layer 104b and a lightly doped n-type third sub-layer 104c. The exposed surface of the epitaxial layer 104 opposite to the base substrate 400 may form a first surface 101 of a semiconductor portion of the finalized device.

Provisional or complete first transistor cells TC1 of a first switching device T1 are formed in the first epitaxial layer 104 by deposition, implant and etch processes applied to the semiconductor substrate 500a from a side defined by the first surface 101. The first switching device may be a vertical switching device with first gate electrodes 150a and field electrodes 160 formed in cell stripes extending from the first surface 101 into the first epitaxial layer 104. First gate dielectrics 205a dielectrically insulate the first gate electrodes 150a from the first epitaxial layer 104. Field dielectrics 202 may dielectrically insulate the field electrodes 160 from the epitaxial layer 104 and the first gate electrodes 150a.

A first dielectric structure 220a may be provided on the first surface 101 and contact grooves 105 may be etched through openings in the first dielectric structure 220a into semiconductor mesas formed between adjoining cell stripes. Additional impurities may be introduced into the first epitaxial layer 104 by diffusion and/or implant processes through the first surface 101 for forming source zones, channel/body zones and contact zones. In the case of implants, the implant damages may or may not be annealed at this stage and the implants may or may not be diffused at this stage. A thin metal barrier liner 301 may be deposited that lines the contact grooves 105 and that covers the first dielectric structure 220a.

Figure 5C:
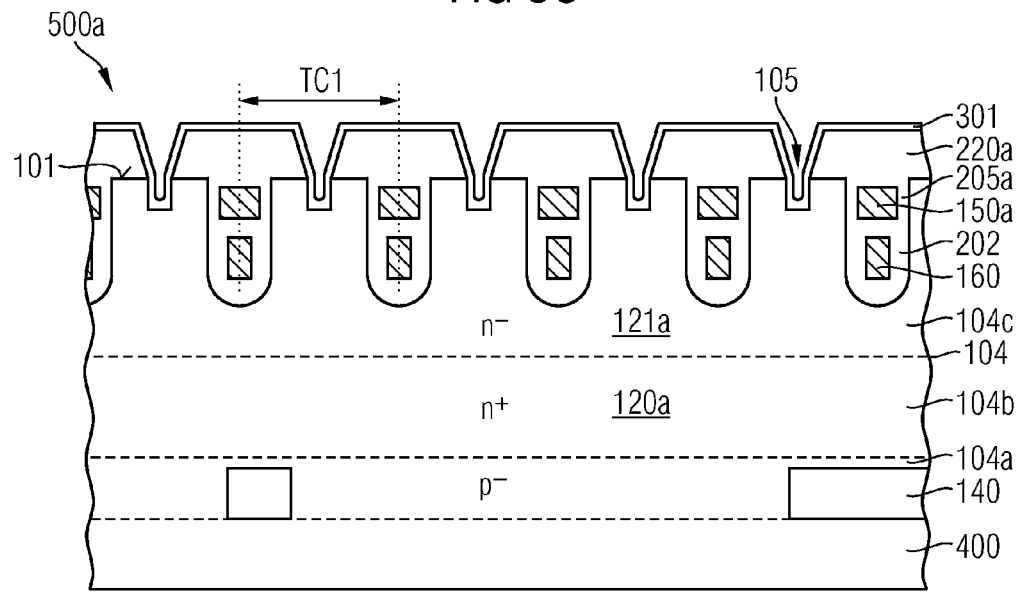
FIG. 5C is a schematic cross-sectional view of the semiconductor substrate portion of FIG. 5B after providing first provisional transistor cells in the first epitaxial layer.

FIG. 5C shows the completed or provisional first transistor cells TC1 and the metal barrier liner 301. The metal barrier liner 301 may consist of or contain titanium nitride (TiN) or tantalum nitride (TaN), by way of example. The second sub-layer 104b may correspond to or include a first drain zone 120a and the third sub-layer 104c may correspond to or include a first drift zone 121a of the first switching device.

A protection layer 710 may be deposited on the metal barrier liner 301 and a carrier 720 may be fixed, e.g. adhered or bonded, to the protection layer 710.

Figure 5D:
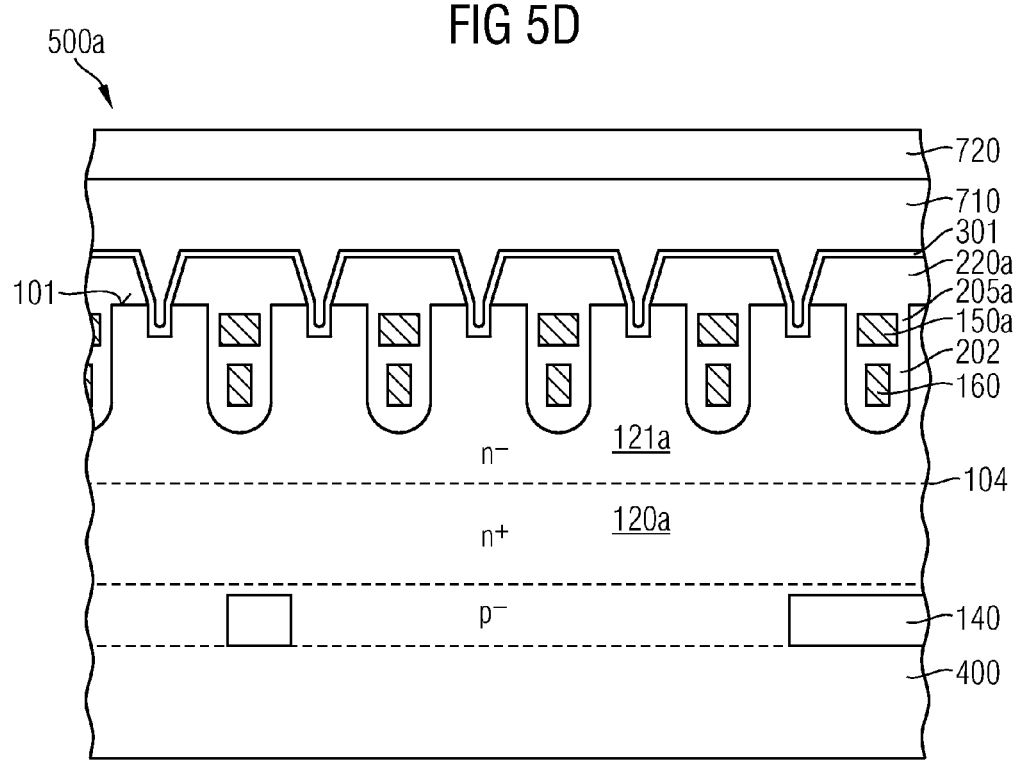
FIG. 5D is a schematic cross-sectional view of the semiconductor substrate portion of FIG. 5C after applying a carrier on the side of the first epitaxial layer.

FIG. 5D shows the protection layer 710 provided from a material that can be removed with high selectivity against the material of the metal barrier liner 301 and withstands the process temperatures applied for providing the second switching device, e.g. a glass. The carrier 720 may be a metal chunk or a silicon plate directly bonded to a silicon-containing protection layer 710, by way of example.

The semiconductor substrate 500a is turned upside down (flipped) such that a second process surface of the base substrate 400 side opposite to the first surface 101 is accessible for deposition, etch, implant and polishing processes. The base substrate 400 may be thinned or may be removed completely, e.g. by a chemical/mechanical polishing process. In addition to the base substrate 400, other embodiments may provide removing a portion of the first epitaxial layer 104 adjoining the base substrate 400. The auxiliary structures 140 may be used for endpoint detection in a polishing process.

Figure 5E:
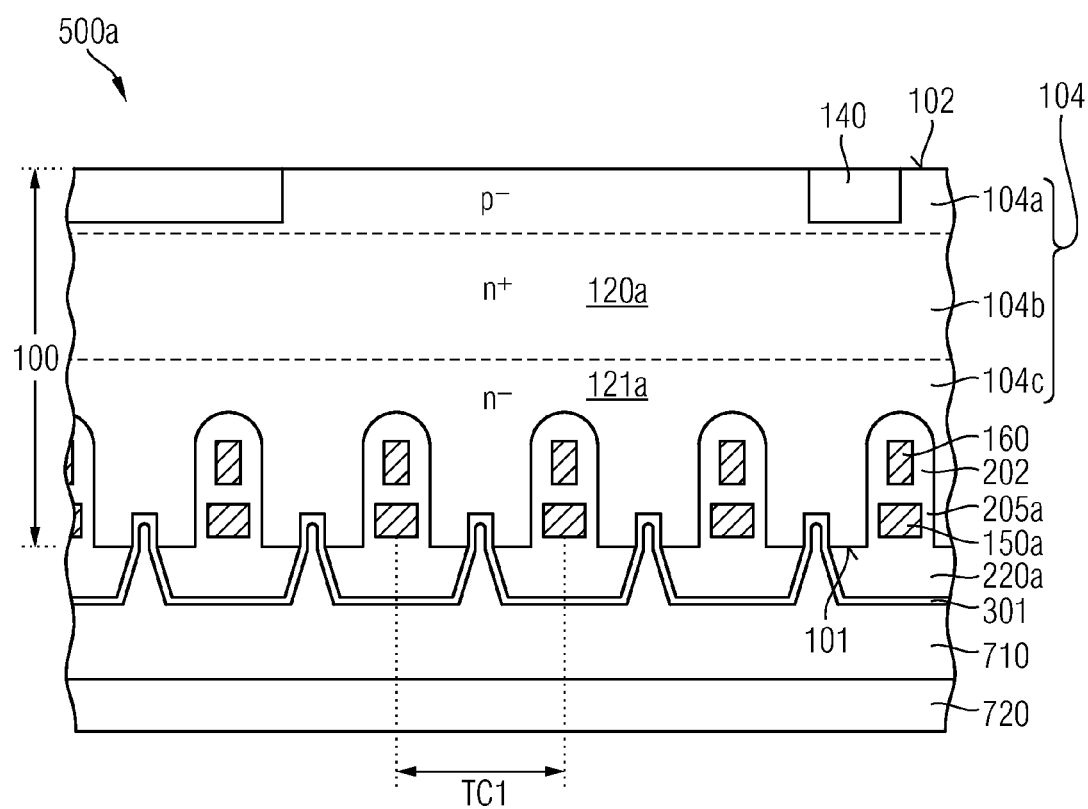
FIG. 5E is a schematic cross-sectional view of the semiconductor substrate portion of FIG. 5D after flipping the semiconductor substrate and removing the base substrate.

FIG. 5E shows the semiconductor substrate 500a after a polishing process completely removes the base substrate 400 and stops at the auxiliary structures 140. The polished surface of the epitaxial layer 140 may form the second surface 102 of the semiconductor portion 100 of the finalized device. Defects in a portion of the first epitaxial layer 104 oriented to the second surface 102 may be cured, for example by using etching, annealing, and/or oxidation processes and generating a sacrificial oxide, which may be removed in the following. A further epitaxial layer may or may not be grown on the surface of the semiconductor substrate 500a opposite to the first surface 101.

Second complete or provisional transistor cells TC2 of the second switching device may be formed by providing second gate electrodes 150b, second gate dielectrics 205b that dielectrically insulate the second gate electrodes 150b from the semiconductor portion 100, and a second dielectric structure 220b dielectrically encapsulating the second gate electrodes 150b. The second switching device may be an LDMOS-FET (laterally diffused metal oxide semiconductor FET) in the usual meaning including both metal gate electrodes and non-metal gate electrodes. Additional impurities may be introduced into the first sub-layer 104a by diffusion and/or implant processes through the second surface 102 for forming channel or body, drain, source and contact zones. In the case of implants, the implant damages may or may not be annealed at this stage and the implants may or may not be diffused at this stage.

Figure 5F:
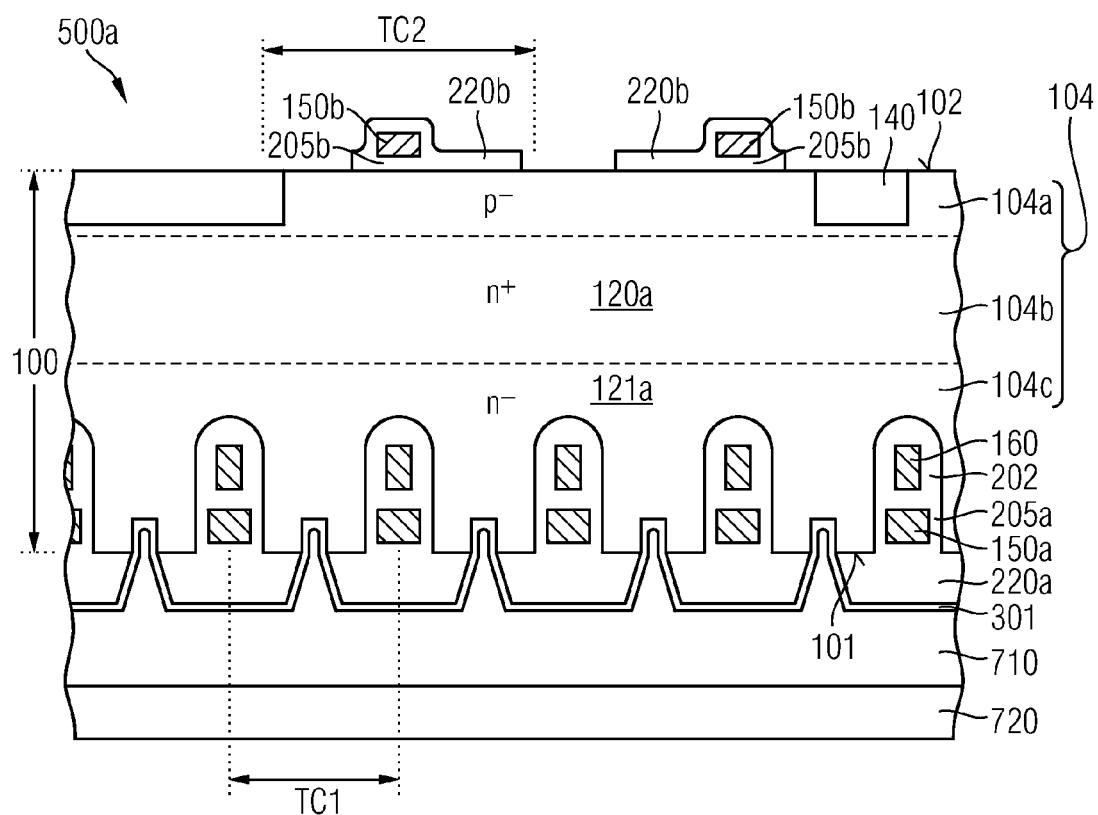
FIG. 5F is a schematic cross-sectional view of the semiconductor substrate portion of FIG. 5E after providing second provisional transistor cells.

FIG. 5F shows the second completed or provisional transistor cells TC2 with second gate dielectrics 205b dielectrically insulating the second gate electrodes 150b from the first epitaxial layer 104.

An etch process may remove the auxiliary structures 140 with high selectivity against the material of the first epitaxial layer 104 to form device connection grooves extending from the second surface 102 into the semiconductor portion 100. The etch process may expose the heavily doped second sub-layer 104b and a further etch process, which may remove heavily doped material at a higher rate than lightly doped material, may be used to deepen the device connection grooves. Device connection structures 305x may be formed in the device connection grooves.

Figure 5G:
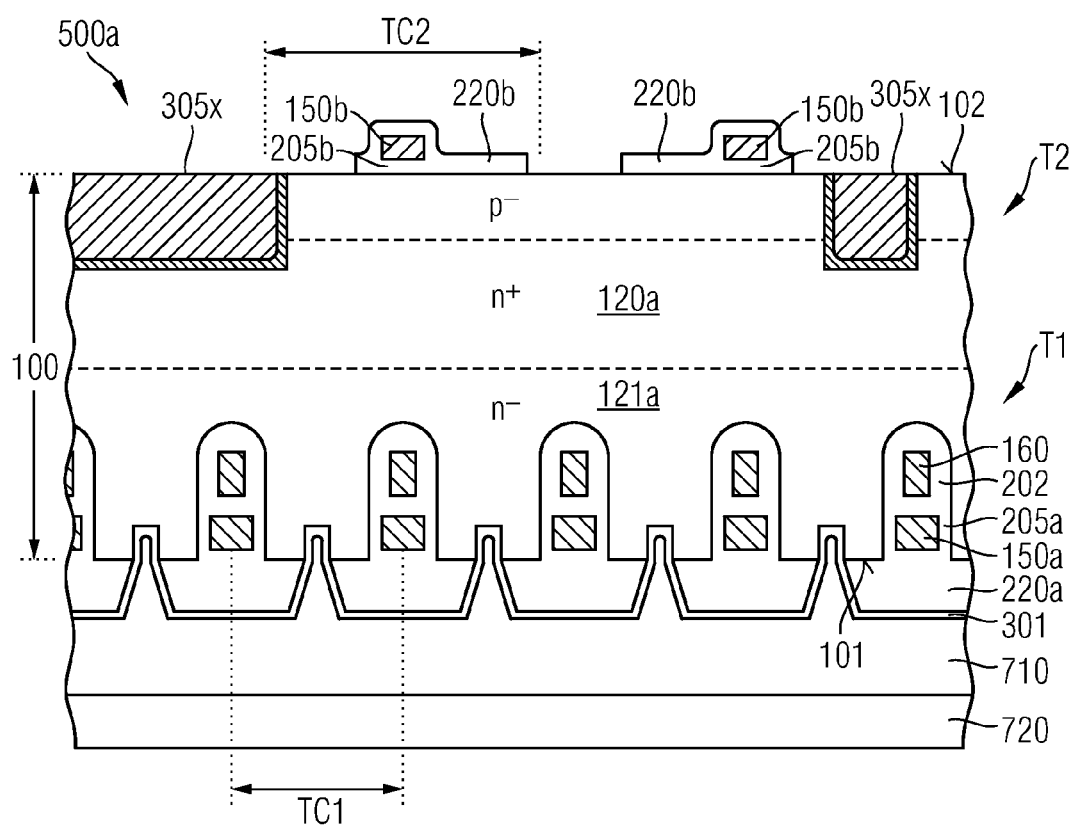
FIG. 5G is a schematic cross-sectional view of the semiconductor substrate portion of FIG. 5F after forming device connection structures.

FIG. 5G shows second transistor cells TC2 of the switching device T2 and device connection structures 305x in place of the auxiliary structures 140 of FIG. 5A. The device connection structures 305x may extend into the second sub-layer 104b and may electrically connect the first drain zones 120a of the first switching device T1 with second source zones of the second switching device T2.

After providing the electrodes of the second switching device T2, the carrier 720 and the protection layer 710 are removed and the electrode structures of the first switching device T1 may be completed. The finalized device may in substance correspond to the integrated circuit 500 of FIG. 1B.

Annealing and/or diffusion of implants concerning the first and second switching devices T1, T2 may be carried out separately or may be combined with each other, e.g. the annealing or the diffusion processes may be carried out simultaneously. Other embodiments may flip the semiconductor substrate 500a before or after forming the metal barrier liner 301 or may flip the semiconductor substrate 500a more than once.

FIGS. 6A to 6E refer to the manufacture of an integrated circuit that vertically integrates two HEMTs. On a first process surface 401 of a base substrate 400, for example on a (111)-surface of a silicon crystal, an epitaxy process grows a first epitaxial layer including at least two group III nitride layers with different band gaps, for example a first buffer layer 180a and a first barrier layer 182a.

FIG. 6A shows the first buffer layer 180a, e.g. a GaN layer, on the first process surface 401 and the first barrier layer 182a, e.g. an AlGaN or InAlN layer, on the first buffer layer 180a. An exposed surface of the first barrier layer 182a opposite to the base substrate 400 may correspond to the first surface 101 of a semiconductor portion of the finalized device. Other embodiments may provide a seed layer from a further group III nitride between the base substrate 400 and the first buffer layer 180a.

First source and drain contacts 305a and a first gate electrode 150a are formed in and on the first epitaxial layer and a passivation layer 190 may be deposited.

As shown in FIG. 6B, the first source and drain contacts 305a extend from the first surface 101 through the first barrier layer 182a into the first buffer layer 180a. The first gate electrode 150a is provided at a distance to an interface between the first buffer and barrier layers 180a, 182a. The passivation layer 190 covers the first surface 101 and encapsulates the first gate electrode 150a as well as the first source and drain contacts 305a. One of the drain and source contacts 305a, for example the drain contact 305a, may extend through the first buffer layer 180a and may directly adjoin the base substrate 400 to provide a portion of a device connection structure.

The semiconductor substrate 500a is turned upside down such that a second process surface 402 of the base substrate 400 side opposite to the first surface 101 is accessible for deposition, etch, implant and polishing processes. The base substrate 400 may or may not be thinned in a grinding process.

Figure 6C:
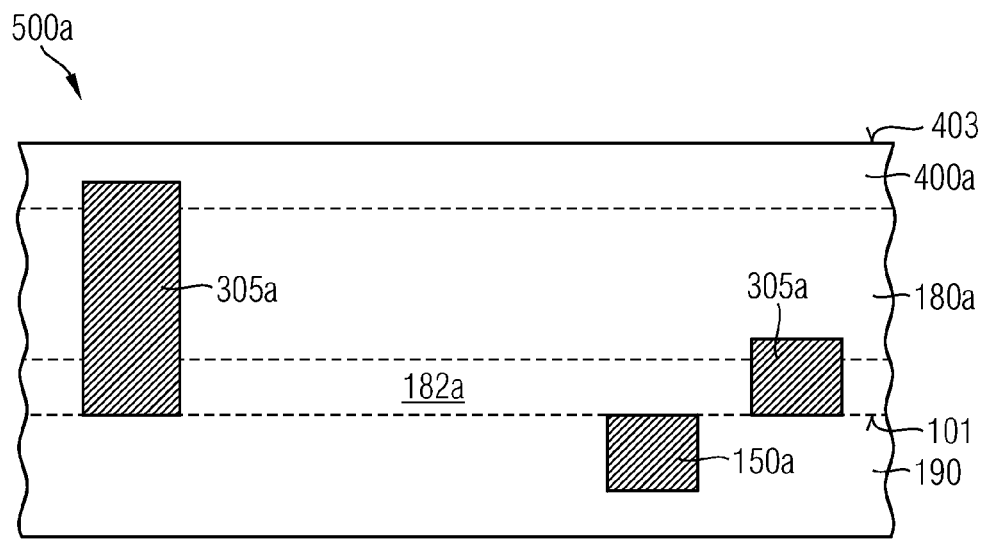
FIG. 6C is a schematic cross-sectional view of the semiconductor substrate portion of FIG. 6B after flipping the semiconductor substrate and thinning the base substrate.

FIG. 6C shows the flipped semiconductor substrate 500a with the thinned base substrate 400a providing a further process surface 403 opposite to the passivation layer 190.

A second epitaxial layer selected from group III nitrides is grown on the further process surface 403. The second epitaxial layer includes at least a second buffer layer 180b and a second barrier layer 182b.

Figure 6D:
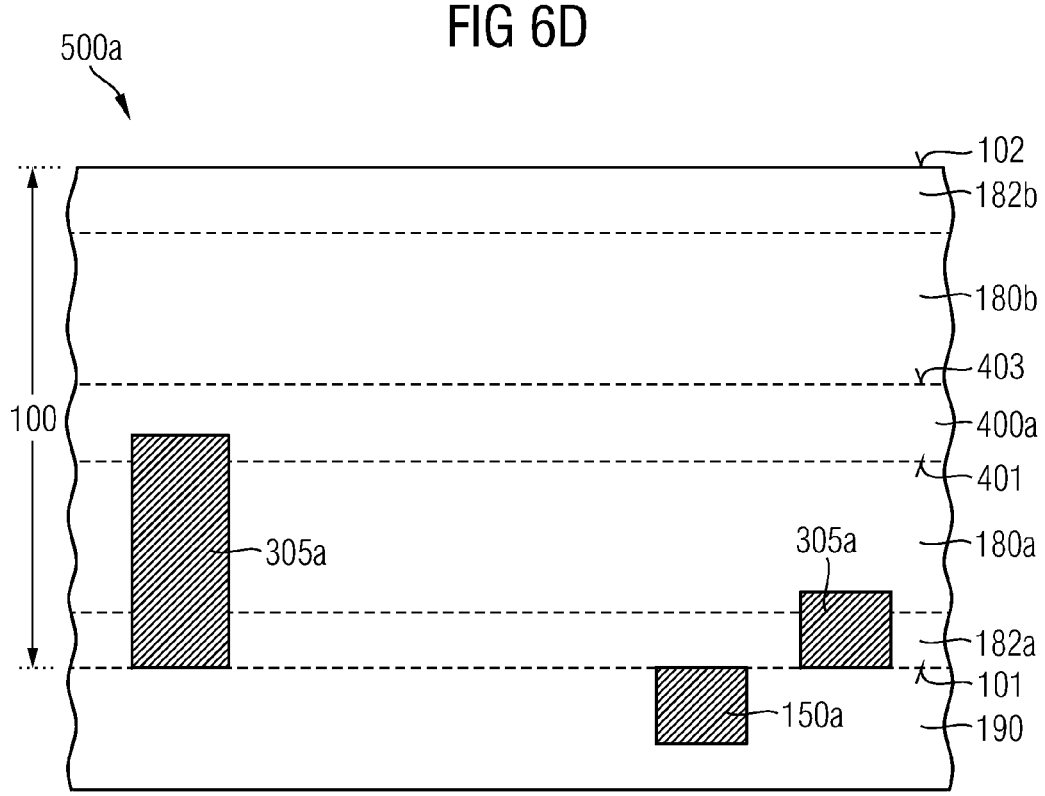
FIG. 6D is a schematic cross-sectional view of the semiconductor substrate portion of FIG. 6C after growing a second epitaxial layer on the thinned base substrate on a side opposite to the first process surface.

In FIG. 6D the second buffer layer 180b directly adjoins the thinned base substrate 400a opposite to the first buffer layer 180a. An exposed surface of the second barrier layer 182b provides the second surface 102 of the semiconductor portion 100 of the finalized device. The materials and dimensions of the first and second buffer layers 180a, 180b may be the same or may be different.

Second gate electrodes 150b as well as second source and drain contacts 305b are formed on and in the second epitaxial layer similar to the first gate electrodes 150a and first source and drain contacts 305a. One of the second drain and source contacts 305b, for example the second source contact 305a, may extend through the second buffer layer 180b, and may directly adjoin the base substrate 400.

Figure 6E:
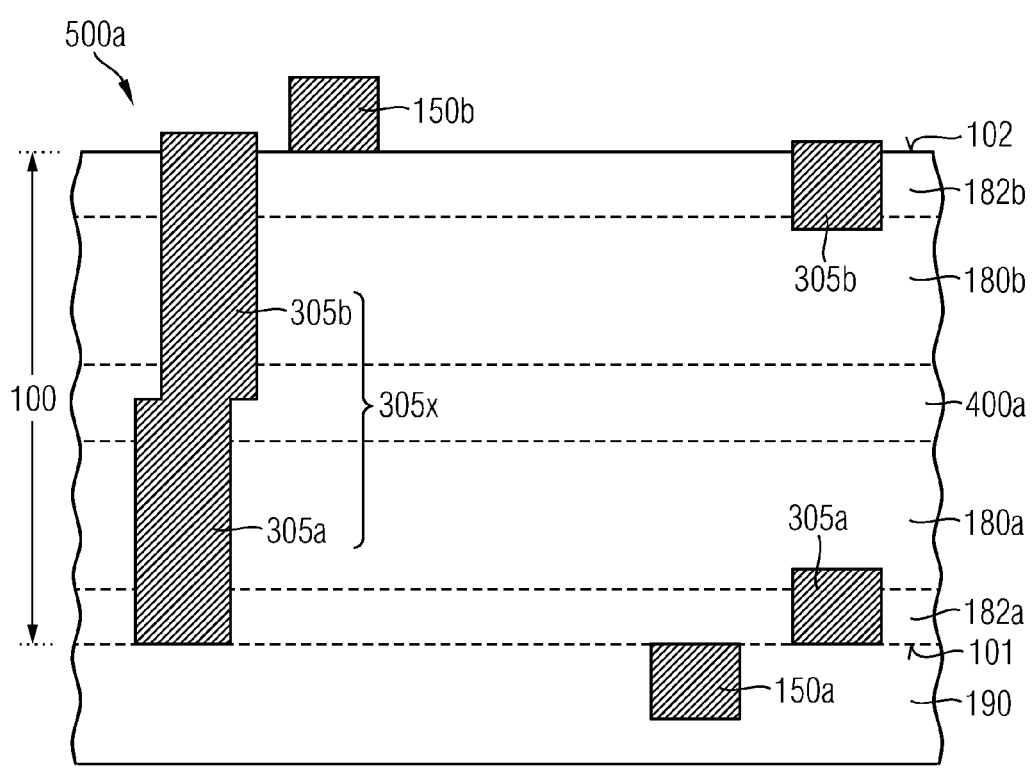
FIG. 6E is a schematic cross-sectional view of the semiconductor substrate portion of FIG. 6D after providing second transistor cells on and in the second epitaxial layer.

In FIG. 6E, the extended first drain and second source contacts 305a, 305b may directly adjoin each other and may form portions of a contiguous device connection structure 305x, wherein the thinned base substrate 400a may be based on a conductive or a dielectric material.

According to other embodiments, the extended first drain and second source contacts 305a, 305b do not directly adjoin each other, wherein the thinned base substrate 400a is based on a conductive material and is part of the device connection structure.

An embodiment of an integrated circuit includes a first switching device including a first semiconductor region in a first section of a semiconductor portion and a second switching device including a second semiconductor region in a second section of the semiconductor portion. The first and second sections and electrode structures of the first and second switching devices outside the semiconductor portion are arranged along a vertical axis perpendicular to a first surface of the semiconductor portion. The first and second sections of the semiconductor portion may directly adjoin each other and form an interface parallel to the first surface.

Another embodiment of an integrated circuit includes a first switching device including a first semiconductor region in a first section of a semiconductor portion and a second switching device including a second semiconductor region in a second section of the semiconductor portion. The first and second sections and electrode structures of the first and second switching devices outside the semiconductor portion are arranged along a vertical axis perpendicular to a first surface of the semiconductor portion. A device connection structure electrically connects one of the electrode structures of the first switching device with one of the electrode structures of the second switching device. The device connection structure is arranged between the first surface and an opposite second surface of the semiconductor portion and is embedded in the semiconductor portion.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
   a first switching device comprising a first semiconductor region in a first section of a semiconductor portion;
   a second switching device comprising a second semiconductor region in a second section of the semiconductor portion, and
   at least one device connection structure extending through the semiconductor portion and directly electrically connected to a source of the first switching device and to a drain of the second switching device, wherein
   the first and second sections and electrode structures of the first and second switching devices outside the semiconductor portion are arranged along a vertical axis perpendicular to a first surface of the semiconductor portion and
   the first and second switching devices are electrically arranged as high-side and low-side switches in a half-bridge configuration, with load paths of the first and second switching devices electrically arranged in series through the device connection structure.

2. The integrated circuit according to claim 1, wherein vertical projections of the first and second semiconductor regions in the vertical direction overlap each other.

3. The integrated circuit according to claim 1, wherein at least one of the first and second switching devices is a vertical transistor with a main load current path along the vertical direction.

4. The integrated circuit according to claim 1, wherein the first switching device is a vertical transistor with a main load current path along the vertical direction and the second switching device is a lateral transistor with a main load current path along a lateral direction parallel to the first surface.

5. The integrated circuit according to claim 1, wherein the first and second sections overlap and the first and second switching devices share an overlapping section of the semiconductor portion.

6. The integrated circuit according to claim 5, wherein the overlapping section is effective as a drain zone of one of the first and second switching devices and as a source zone of the other of the first and second switching devices.

7. The integrated circuit according to claim 1, wherein the at least one device connection structure is electrically connected to a drain zone of one of the first and second switching devices and to a source zone of the other of the first and second switching devices.

8. The integrated circuit according to claim 1, wherein the first switching device comprises a plurality of first transistor cells and the second switching device comprises a plurality of second transistor cells that are arranged in the vertical projection of at least some of the first transistor cells.

9. The integrated circuit according to claim 8, wherein the first transistor cells are regularly arranged at a first center-to-center distance along a first lateral direction parallel to the first surface and the second transistor cells are regularly arranged at a second center-to-center distance along the first lateral direction.

10. The integrated circuit according to claim 1, wherein the first switching device is provided at a first side of the semiconductor portion and the second switching device is provided at a second side of the semiconductor portion opposite to the first side.

11. The integrated circuit according to claim 1, wherein an interface or an overlapping region between the first and second sections extends parallel to the first surface.

12. The integrated circuit according to claim 1, further comprising:
a base substrate between the first and second sections.

13. The integrated circuit according to claim 1 wherein the device connection structure is arranged between the first surface and an opposite second surface of the semiconductor portion.

14. An integrated circuit comprising:
a first switching device comprising a first semiconductor region in a first section of a semiconductor portion of crystalline silicon or germanium;
a second switching device comprising a second semiconductor region in a second section of the semiconductor portion of crystalline silicon or germanium, wherein the first and second sections form an interface and at least the second switching device is a vertical transistor with a main load current path along the vertical direction and with a drain zone formed along the interface between the first and second sections; and
at least one device connection structure extending into the semiconductor portion and electrically connecting the first switching device with the drain zone of the second switching device, wherein
the first and second sections and electrode structures of the first and second switching devices outside the semiconductor portion are arranged along a vertical axis perpendicular to a first surface of the semiconductor portion, and
load paths of the first and second switching devices are electrically arranged in series through the device connection structure.

15. An integrated circuit comprising:
a first switching device comprising a first semiconductor region in a first section of a semiconductor portion;
a second switching device comprising a second semiconductor region in a second section of the semiconductor portion, and
at least one device connection structure extending through the semiconductor portion and directly electrically connected to a source of the first switching device and to a drain of the second switching device, wherein
the first and second sections and electrode structures of the first and second switching devices outside the semiconductor portion are arranged along a vertical axis perpendicular to a first surface of the semiconductor portion,
the first and second switching devices are electrically arranged as high-side and low-side switches in a half-bridge configuration, with load paths of the first and second switching devices electrically arranged in series through the device connection structure, and
at least one of the first and second switching devices is a lateral high electron mobility transistor with a main load current path along a lateral direction parallel to the first surface.

* * * * *